US007384839B2

(12) United States Patent
Yang et al.

(10) Patent No.: US 7,384,839 B2
(45) Date of Patent: Jun. 10, 2008

(54) SRAM CELL WITH ASYMMETRICAL TRANSISTORS FOR REDUCED LEAKAGE

(75) Inventors: Shyh-Horng Yang, Plano, TX (US); Kayvan Sadra, Addison, TX (US); Theodore W. Houston, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 337 days.

(21) Appl. No.: 11/239,626

(22) Filed: Sep. 29, 2005

(65) Prior Publication Data

US 2007/0069277 A1 Mar. 29, 2007

(51) Int. Cl.
*H01L 21/8238* (2006.01)

(52) U.S. Cl. ...................... 438/231; 438/514; 438/525; 257/E21.661

(58) Field of Classification Search ................ 438/152, 438/200, 210, 231, 289–291, 301, 302, 514, 438/525; 257/206, 379–381, 393, 903–904, 257/E21.661

See application file for complete search history.

(56) References Cited

U.S. PATENT DOCUMENTS 6,008,080 A * 12/1999 Chuang et al. ............. 438/200

* cited by examiner

*Primary Examiner*—Thien F Tran
(74) *Attorney, Agent, or Firm*—Jacqueline J. Garner; W. James Brady, III; Frederick J. Telecky, Jr.

(57) ABSTRACT

A method of fabricating an SRAM cell with reduced leakage is disclosed. The method comprises fabricating asymmetrical transistors in the SRAM cell. The transistors are asymmetrical in a manner that reduces the drain leakage current of the transistors. The fabrication of asymmetrical pass transistors comprises forming a dielectric region on a surface of a substrate having a first conductivity type. A gate region having a length and a width is formed on the dielectric region. Source and drain extension regions having a second conductivity type are formed in the substrate on opposite sides of the gate region. A first pocket impurity region having a first concentration and the first conductivity type is formed adjacent the source. A second pocket impurity region having a second concentration and the first conductivity type may be formed adjacent the drain. If formed, the second concentration is smaller than the first concentration, reducing the gate induced drain leakage current.

10 Claims, 13 Drawing Sheets

SRAM CELL WITH ASYMMETRICAL TRANSISTORS FOR REDUCED LEAKAGE

FIELD OF THE INVENTION

This invention generally relates to electronic circuits, and more specifically to fabrication and structure of field-effect transistors with asymmetrical threshold voltages.

BACKGROUND OF THE INVENTION

The continuing popularity of portable electronic devices presents manufacturers with significant challenges. Increasing capability of electronic devices is moderated by considerations of cost, size, weight, and battery life. These considerations have increasingly resulted in higher levels of semiconductor integration. Thus, portable electronic devices frequently embed memory, control, signal processors, and other circuit functions on a single integrated circuit. Further optimization of these portable electronic devices dictates even greater reduction in geometric feature sizes and spaces between these geometric features. Shrinking feature sizes require lower supply voltages to limit maximum electric fields. Transistor leakage must be minimized to reduce standby current and prolong battery life. Even with lower supply voltages, however, special considerations are required for reliable device operation.

One problem of source/drain resistance was addressed by Yamazaki, U.S. Pat. No. 5,547,888, which is incorporated herein by reference in its entirety. Therein, Yamazaki discloses a disadvantage of symmetrical lightly doped drain (LDD) transistors in a static random access memory (SRAM) cell. Yamazaki discloses that hot carrier reliability only depends on the drain structure and not the source structure. Yamazaki also discloses that a source LDD region may limit on current of the transistor and require a greater channel length. Yamazaki discloses a method of masking the source region of the transistor during the LDD implant to produce an asymmetrical transistor with only a drain LDD implant.

A problem of punch through with short channel lengths was addressed by Wang et al., U.S. Pat. No. 6,566,204, which is incorporated herein by reference in its entirety. Punch through occurs when source and drain depletion regions of a field effect transistor extend across the channel. Under these conditions, the overlying control gate can no longer control current flow between the source and drain. Pocket implants were previously used to locally increase bulk concentration in the channel region of the field effect transistor, thereby limiting depletion region width and resulting punch through. Pocket implants in the drain region, however, limited drive current and increased threshold voltage. Wang et al. disclosed that punch through could be effectively curtailed with an asymmetrical pocket implant adjacent the source of the field effect transistor. Wang et al. further disclose a method of blocking the pocket implant at the drain of the field effect transistor with a mask pattern in close proximity to the control gate of the field effect transistor. The close proximity of the mask pattern selectively blocks the angled pocket implant but permits implantation of source/drain zones without the need for additional masking steps.

Lien, U.S. Pat. No. 5,790,452, is incorporated herein by reference in its entirety. Lien applied an angled pocket implant to a static random access memory (SRAM) cell to solve a different problem. Referring to FIG. 1A, there is a schematic diagram of an SRAM cell 100 of the prior art disclosed by Lien as FIG. 2. The SRAM cell includes a latch formed by load resistors 101 and 102 and N-channel drive transistors 103 and 104. The latch is connected between positive supply voltage Vdd 112 and ground or Vss 114. The supply voltage levels Vdd and Vss are also referred to as high and low levels, respectively, for simplicity. Storage nodes 116 and 118 of the latch are connected to bitlines 108 and 110 by access transistors 105 and 106, respectively.

Lien disclosed two conflicting modes of operation of the SRAM cell. During write-disturb mode the SRAM cell of FIG. 1A is not accessed and the wordline 120 is low. Storage nodes 116 and 118 are low and high, respectively, and complementary bitline 110 is low. Under this condition, access transistor 106 has significant subthreshold leakage. Lien discloses a high threshold voltage, therefore, is desirable to limit subthreshold leakage when storage node 118 is high and bitline 110 is low. During read mode bitlines 108 and 110 are both initially high and wordline 120 is high. When the latch storage nodes 116 and 118 are low and high, respectively, Lien discloses an advantage to a low threshold voltage on access transistor 106. This low threshold voltage of access transistor 106 provides a higher voltage at storage node 118 and, therefore, a greater gate voltage at drive transistor 103. Thus, Lien discloses an advantage of a low threshold voltage of access transistor 106 when bitline 110 is positive with respect to storage node 118 in read mode.

Referring to FIG. 1B, there is a cross section of N-channel access transistor 106 of the prior art as disclosed by Lien at FIG. 3. The access transistor 106 includes N+ source/drain region 118 connected to storage node 118 and N+ source/drain region 110 connected to bitline 110. An N-type lightly doped region 132 extends from N+ source/drain region 118 into the channel region under control gate 134. A P-type pocket implant encloses N+ source/drain region 110. When the N+ drain 118 is positive with respect to N+ source 110, Lien discloses access transistor 106 has a high threshold voltage. Alternatively, when the N+ drain 110 is positive with respect to N+ source 118, access transistor 106 has a low threshold voltage.

SUMMARY OF THE INVENTION

In accordance with a preferred embodiment of the invention, there is disclosed a method fabricating an SRAM cell with reduced leakage. The method comprises fabricating asymmetrical transistors in the SRAM cell. The transistors are asymmetrical in a manner that reduces the gate induced drain leakage current of the transistors. The fabrication of asymmetrical pass transistors comprises forming a dielectric region on a surface of a substrate having a first conductivity type. A gate region having a length and a width is formed on the dielectric region. Source and drain extension regions having a second conductivity type are formed in the substrate on opposite sides of the gate region. A first pocket impurity region having a first concentration and the first conductivity type is formed adjacent the source. A second pocket impurity region having a second concentration and the first conductivity type may be formed adjacent the drain. If formed, the second concentration is smaller than the first concentration, reducing the gate induced drain leakage current.

BRIEF DESCRIPTION OF THE DRAWINGS

The foregoing features of the present invention may be more fully understood from the following detailed description, read in conjunction with the accompanying drawings, wherein.

DETAILED DESCRIPTION OF PREFERRED EMBODIMENTS

Figure 15:
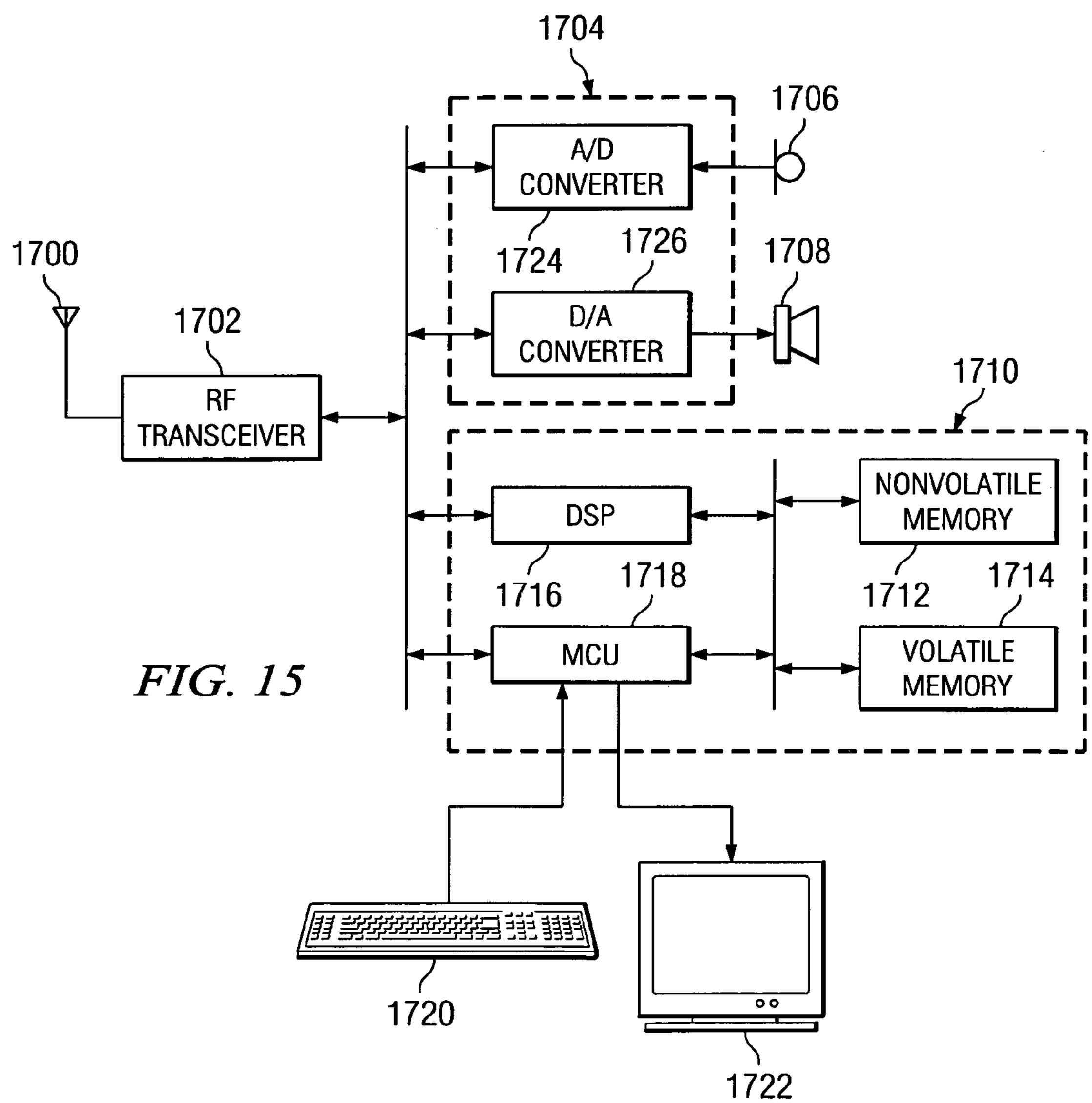
FIG. 15 is a block diagram of a wireless telephone as an example of a portable electronic device which could advantageously employ the present invention.

Referring to FIG. 15, there is a block diagram of a wireless telephone as an example of a portable electronic device which could advantageously employ this invention. The wireless telephone includes antenna 1700, radio frequency transceiver 1702, baseband circuits 1710, microphone 1706, speaker 1708, keypad 1720, and display 1722. The wireless telephone is preferably powered by a rechargeable battery (not shown) as is well known in the art. Antenna 1700 permits the wireless telephone to interact with the radio frequency environment for wireless telephony in a manner known in the art. Radio frequency transceiver 1702 both transmits and receives radio frequency signals via antenna 1702. The transmitted signals are modulated by the voice/data output signals received from baseband circuits 1710. The received signals are demodulated and supplied to baseband circuits 1710 as voice/data input signals. An analog section 1704 includes an analog to digital converter 1724 connected to microphone 1706 to receive analog voice signals. The analog to digital converter 1724 converts these analog voice signals to digital data and applies them to digital signal processor 1716. Analog section 1704 also includes a digital to analog converter 1726 connected to speaker 1708. Speaker 1708 provides the voice output to the user. Digital section 1710 is embodied in one or more integrated circuits and includes a microcontroller unit 1718, a digital signal processor 1716, nonvolatile memory circuit 1712, and volatile memory circuit 1714. Nonvolatile memory circuit 1712 may include read only memory (ROM), ferroelectric memory (FeRAM), FLASH memory, or other nonvolatile memory as known in the art. Volatile memory circuit 1714 may include dynamic random access memory (DRAM), static random access memory (SRAM), or other volatile memory circuits as known in the art. Microcontroller unit 1718 interacts with keypad 1720 to receive telephone number inputs and control inputs from the user. Microcontroller unit 1718 supplies the drive function to display 1722 to display numbers dialed, the current state of the telephone such as battery life remaining, and received alphanumeric messages. Digital signal processor 1716 provides real time signal processing for transmit encoding, receive decoding, error detection and correction, echo cancellation, voice band filtering, etc. Both microcontroller unit 1718 and digital signal processor 1716 interface with nonvolatile memory circuit 1712 for program instructions and user profile data. Microcontroller unit 1718 and digital signal processor 1716 also interface with volatile memory circuit 1714 for signal processing, voice recognition processing, and other applications.

Figure 1A:
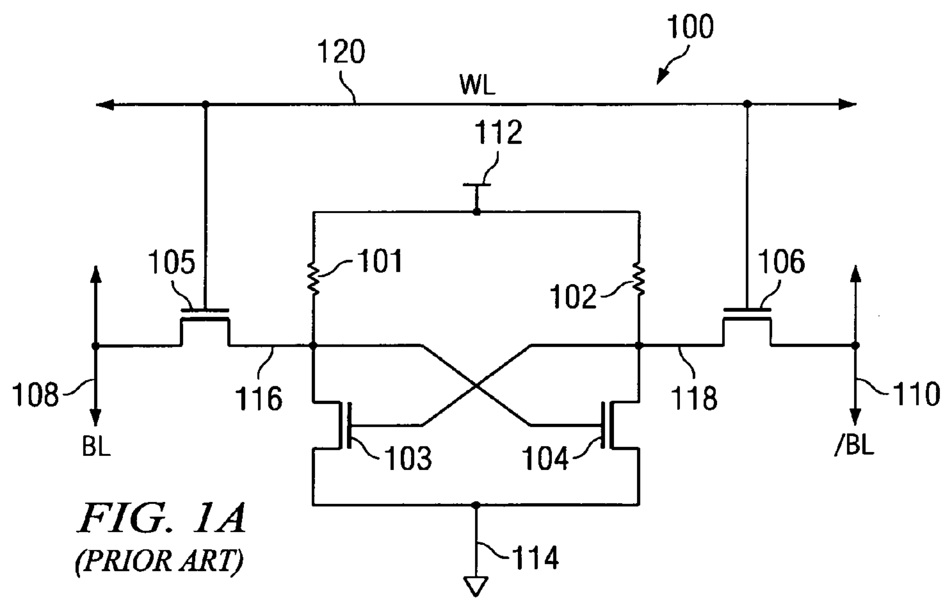
FIG. 1A is a diagram of a static random access memory (SRAM) cell of the prior art.
Figure 1B:
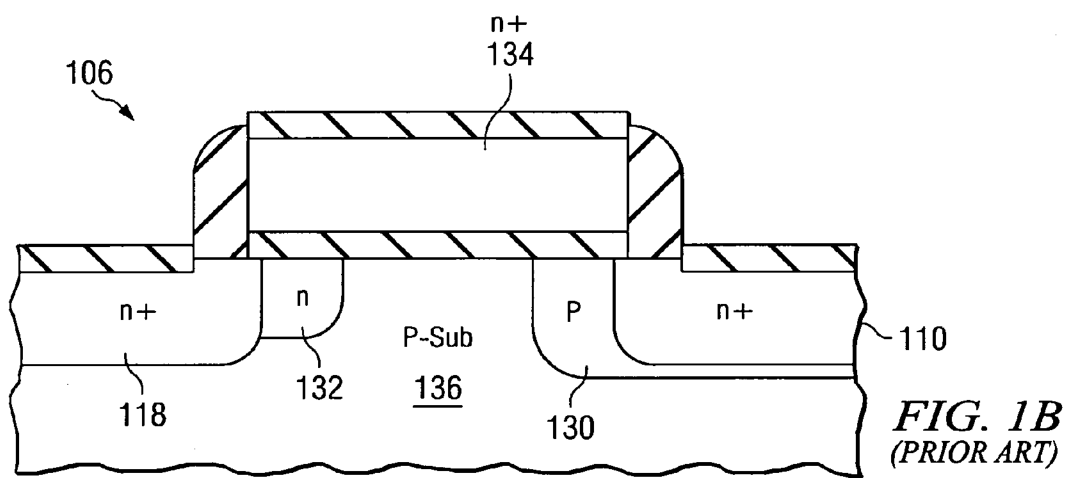
FIG. 1B is a cross sectional view of prior art access transistor 106 of FIG. 1A.
Figure 2:
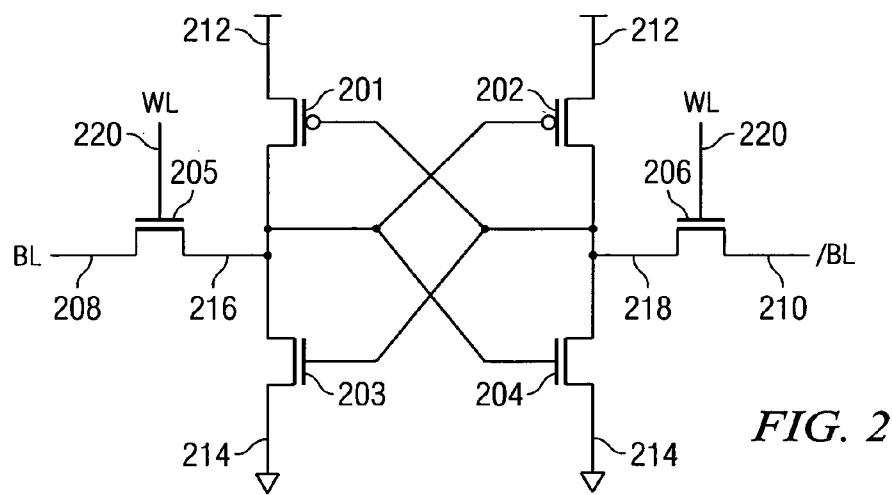
FIG. 2 is a schematic diagram of a six-transistor static random access memory cell that may advantageously use the present invention.
Figure 3:
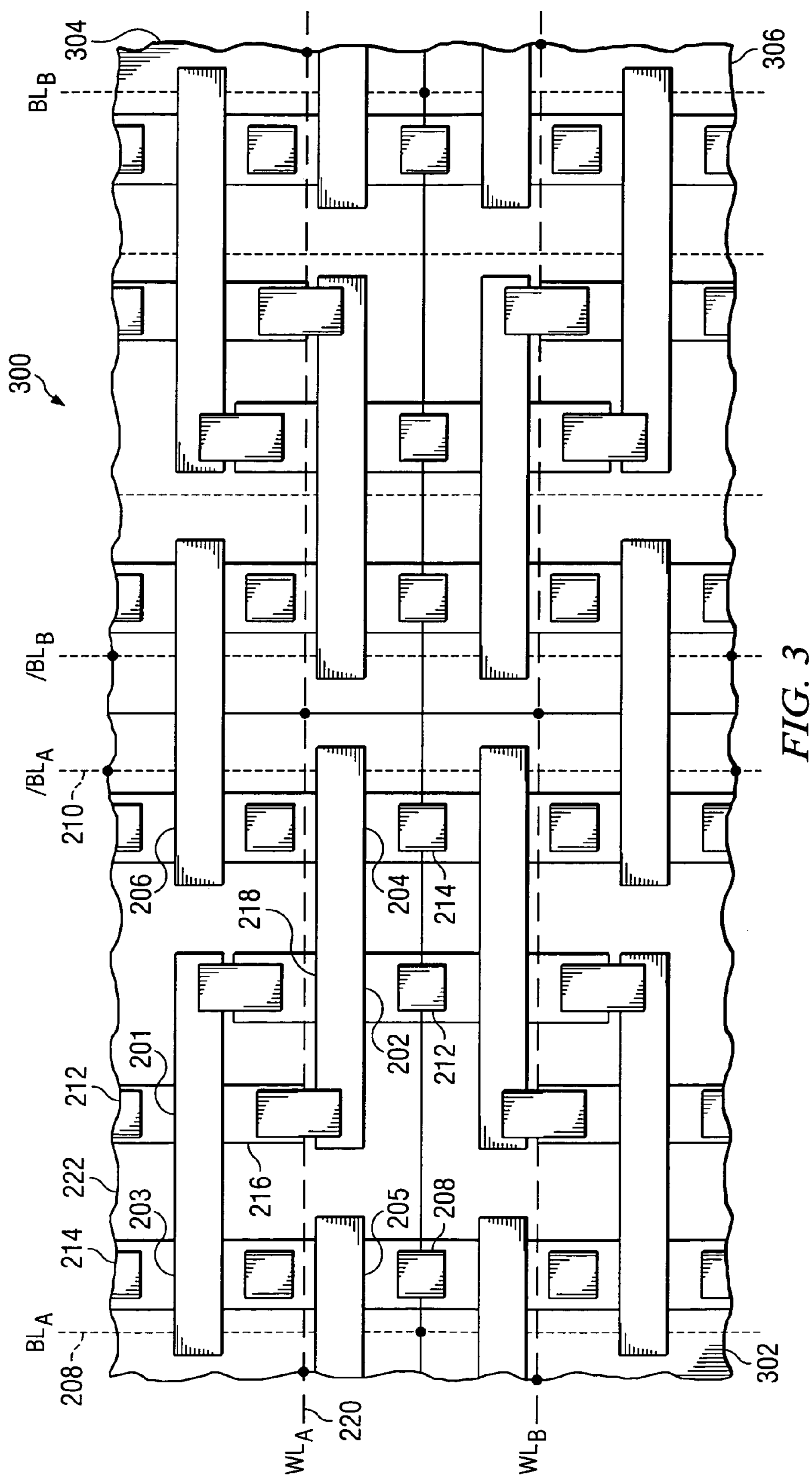
FIG. 3 is a layout diagram of an array of four memory cells as in FIG. 2.

Turning now to FIG. 2, the electrical circuit corresponding to exemplary memory cell 300 of FIG. 3 will be explained in detail. Each of the four memory cells 300-306 of FIG. 3 is electrically identical to the schematic diagram of FIG. 2. Moreover, the geometric layout of each memory cell of FIG. 3 is substantially identical except that they may be placed in different views. Memory cell 300 is bounded to the right and below by memory cells 304 and 302, respectively, as indicated by the solid line cell boundaries. Memory cell 300 includes a latch formed by P-channel load transistors 201 and 202 and N-channel transistors 203 and 204. These transistors are indicated by polycrystalline silicon gate regions crossing an active region. Source terminals of P-channel load transistors 201 and 202 are connected to positive Vdd supply voltage in metal (not shown) at metal-to-P+ contact areas 212. Drain terminals of load transistors 201 and 202 are connected to the storage nodes 216 and 218. Likewise, source terminals of N-channel driver transistors 203 and 204 are connected to ground or Vss supply voltage in metal (not shown) at metal-to-N+ contact areas 214. Drain terminals of the N-channel driver transistors 203 and 204 are connected to the storage nodes 216 and 218 in metal (not shown). Each of the metal-to-silicon contact areas 212 and 214 is formed by a half contact in each of two adjacent cells. Storage nodes 216 and 218 are output terminals of the latch as indicated at FIG. 3 by metal-to-P+ contact areas. The connection of the drain of transistor 203 and drain of transistor 201 comprising storage node 216 is not shown for clarity. Similarly, the connection of the drain of transistor 204 and drain of transistor 202 comprising storage node 218 is not shown. These storage nodes 216 and 218 are connected to access N-channel transistors 205 and 206, respectively. Gates of the N-channel transistors 205 and 206 are connected to word line 220 indicated by a dashed line. The other terminals of N-channel transistors 205 and 206 are connected to bit line $BL_A$ 208 and complementary bit line/$BL_A$ 210 indicated by dotted lines, respectively.

Decreasing feature sizes and gate oxide thicknesses of present process technology make the memory cell of FIGS. 2 and 3 particularly susceptible to off-state drain leakage current, which includes both gate induced drain leakage (GIDL) and gate-edge diode drain leakage (GEDL). This problem occurs, for example, when storage nodes 216 and 218 are high and low, respectively. P-channel load transistor 201 is on and N-channel driver transistor 203 is off. Complementary P-channel load transistor 202, therefore, is off and N-channel driver transistor 204 is on. N-channel drive transistor 203 has a high level (Vdd) at the drain or storage node 216 and ground at the source terminal 214. The gate of N-channel transistor 203 is held low by N-channel transistor 204. This low level of the gate holds the channel region adjacent the drain of N-channel transistor 203 in strong accumulation. This creates a high electric field at the lightly doped drain junction (LDD) and the P-type channel under the gate edge. The electric field is particularly high when the substrate adjacent the drain is fabricated with a P+ pocket implant. The resulting high electric field may even deplete or invert the N-type drain LDD region. This creates a gate induced drain leakage (GIDL) current path even when N-channel transistor 203 is off. Likewise, the diode formed between the LDD region and the substrate exhibits a leakage current (GEDL). This leakage current also increases with increasing P+ pocket region concentration.

A corresponding gate induced drain leakage current path may exist in P-channel load transistor 202. P-channel load transistor 202 has a high level (Vdd) at the source and a low level at the drain or storage node 218. The gate of P-channel transistor 202 is held high by P-channel transistor 201. This high level of the gate holds the channel region adjacent the drain of P-channel transistor 202 in strong accumulation. This creates a high electric field at the lightly doped drain junction (LDD) and the N-type substrate under the gate edge. This high electric field may even deplete or invert the P-type drain LDD region. The electric field is particularly high when the substrate adjacent the drain is fabricated with an N+ pocket implant. The resulting high electric field creates a gate induced drain leakage (GIDL) current path even when P-channel transistor 202 is off. Likewise, the diode formed between the LDD region and the substrate exhibits a leakage current (GEDL). This leakage current also increases with increasing N+ pocket region concentration.

These drain leakage current paths may exist in N-channel drive transistors, P-channel load transistors, or both. The cumulative leakage current for a typical memory array significantly increases standby current. Elimination of the pocket implant improves the drain leakage current path but introduces new problems of low threshold voltages and even punch through. Thus, an asymmetrical pocket implant adjacent the source and blocked from the drain provides a solution to the drain leakage current that does not introduce other problems. It is also desirable to avoid introduction of an additional mask step to form this asymmetrical pocket implant while maintaining an existing lightly doped drain (LDD) implant as will be described in detail.

Figure 4A:
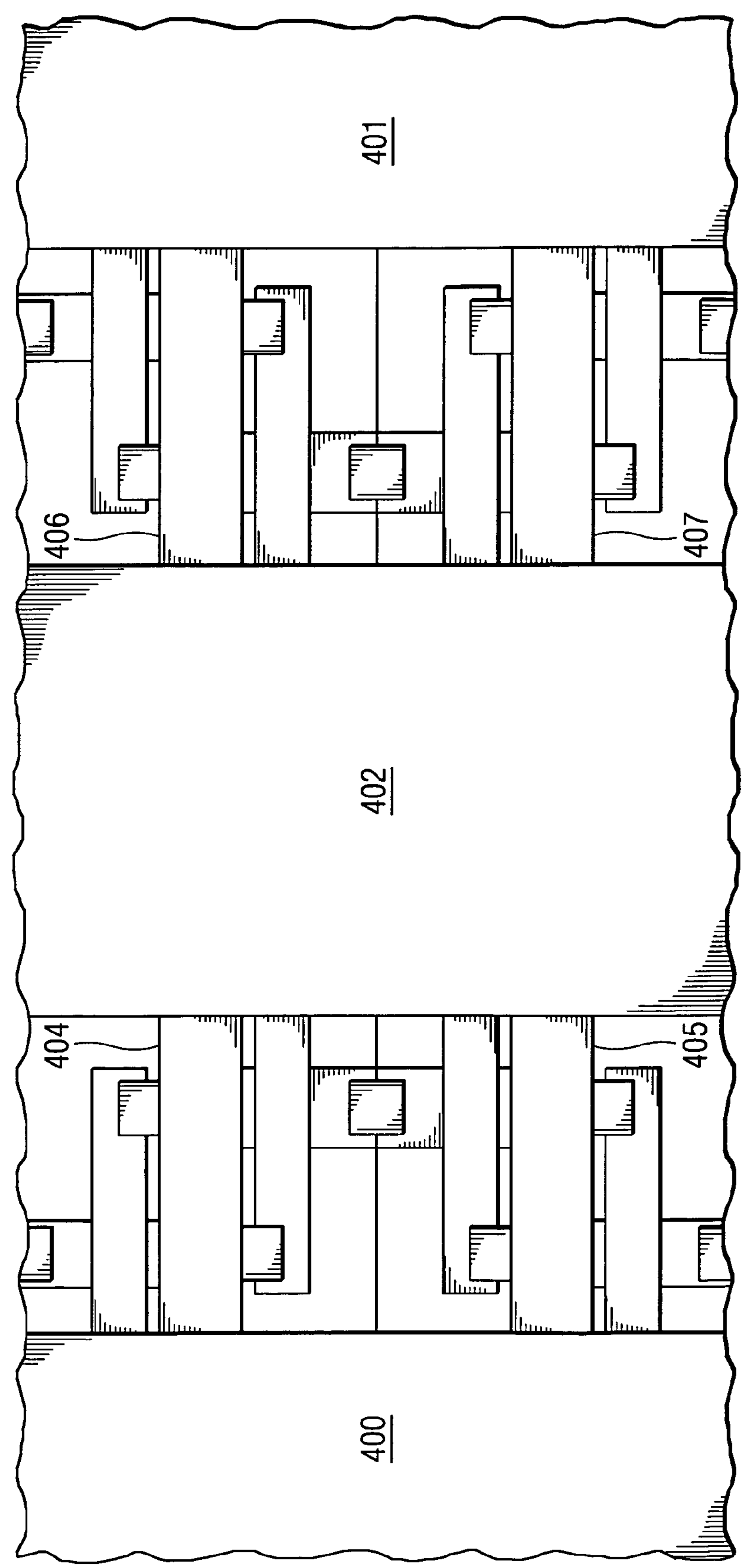
FIG. 4A is a layout diagram of the array of four memory cells of FIG. 2 with an P-channel implant mask.
Figure 4B:
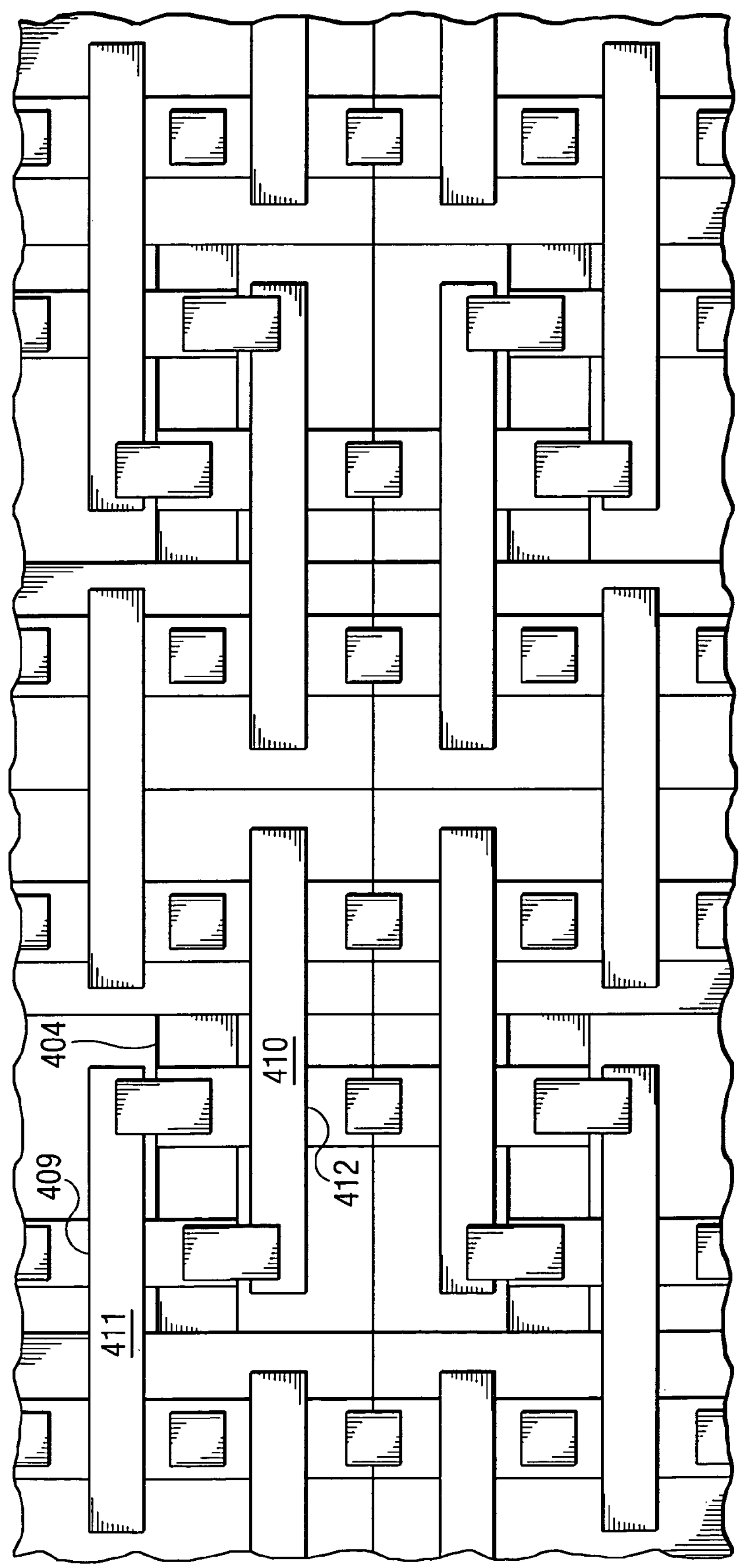
FIG. 4B is the layout diagram of FIG. 4A showing the outline of the implant mask for clarity.

Turning now to FIG. 4A, there is a layout diagram of the array of four memory cells of FIG. 2 with a P-channel implant mask formed by photoresist. The mask includes portions 400, 401, and 402, which cover N-channel transistors 203, 204, 205 and 206, and portions 404, 405, 406, and 407, formed between adjacent P-channel load transistors. FIG. 4B is the layout diagram of FIG. 4A showing the outline of the implant mask under the cell geometries for clarity. Mask portion 404 is adjacent and spaced apart from load transistor gate edges 409 and 410, respectively. The space between each mask portion and the respective adjacent gate edge allows a lightly doped P-type ion implant with a small tilt angle to produce lightly doped source and drain regions on each load transistor. The closely spaced photoresist portion 404 blocks drain-side load transistor gate edges 409 and 410 from receiving angled N-type pocket implants as will be explained in detail. The pocket implant is not blocked from source-side load transistor gate edges 411 and 412. Thus, the asymmetrical N-type pocket implant and the lightly doped source and drain implants may be performed without an extra photoresist mask step according to the embodiment of FIG. 4B.

Figure 5A:
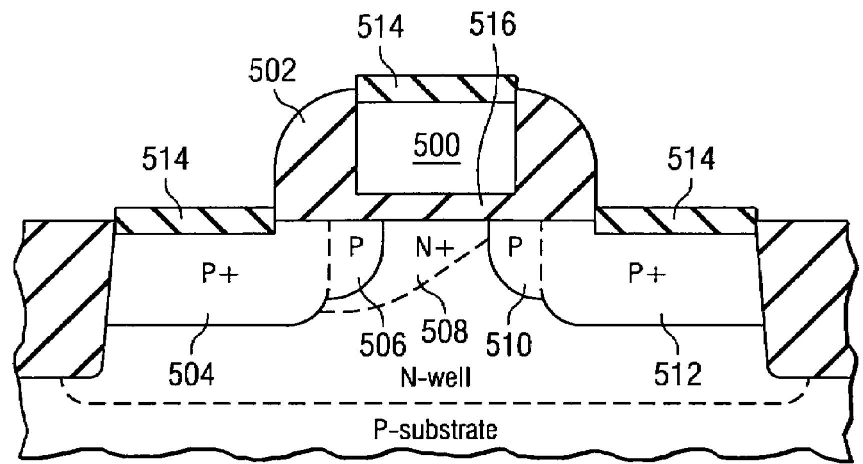
FIG. 5A is cross section of a P-channel transistor showing a pocket implant of the present invention.
Figure 5B:
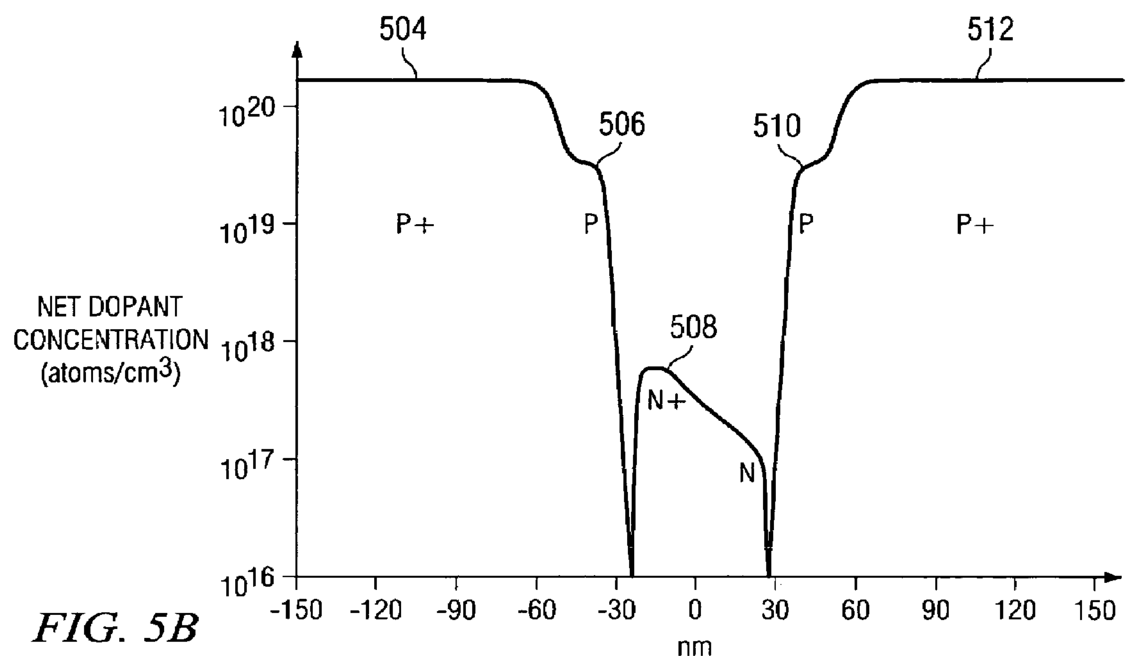
FIG. 5B is a drain-to-source surface concentration profile of the transistor of FIG. 5A.

Referring now to FIG. 5A, there is a cross section diagram showing an exemplary P-channel load transistor such as transistors 201 and 202 according to the present invention. FIG. 5B is a corresponding surface concentration extending from source region 904 to drain region 912 of the P-channel load transistor of FIG. 5A. The P-channel load transistor is fabricated on an N-well region or substrate formed on a P-substrate. A gate dielectric 916 is formed over the N-well substrate. A control gate 900 is formed over the gate dielectric 916. P+ source 904 and drain 912 regions are formed on each side of the control gate 900. Corresponding P-type LDD regions 906 and 910 are formed adjacent respective P+ regions 905 and 912 to complete the source and drain regions. An N-type impurity pocket implant is formed adjacent the source region 906. The N-type impurity pocket implant, however, is at least partially blocked adjacent the drain region 910. Referring to FIG. 5B, therefore, the concentration of pocket implant 908 adjacent source region 906 has a greater concentration than the portion adjacent drain region 910. This asymmetrical P-channel load transistor advantageously reduces gate induced drain leakage current in the memory array with respect to memory cells with drain pocket implants. The source pocket implant maintains an acceptable threshold voltage and avoids punch through at normal operating voltages. Moreover, a single mask step is used to form the asymmetrical pocket implant and the symmetrical LDD implant.

Figure 6:
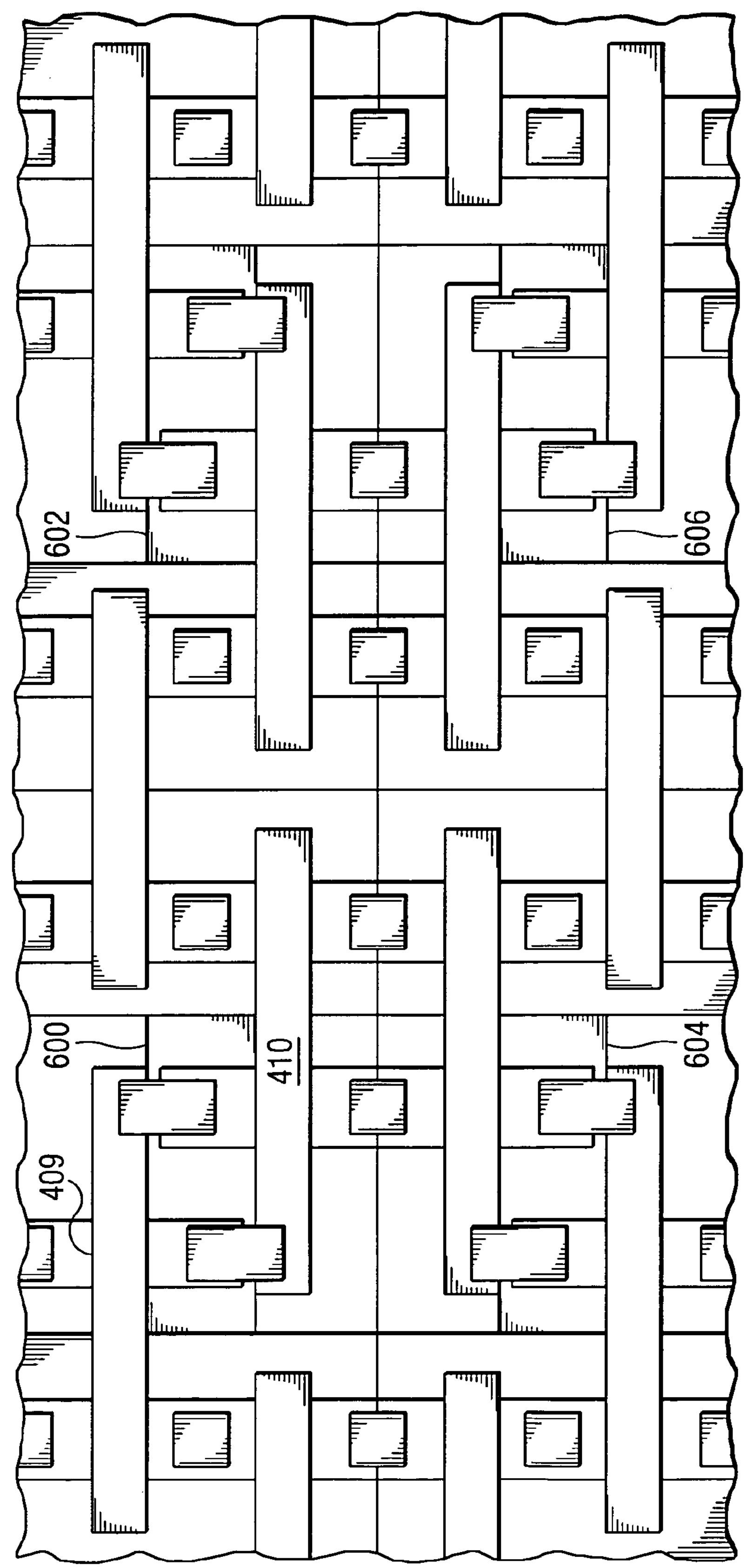
FIG. 6 is another embodiment of the layout diagram of FIG. 4B.

Turning now to FIG. 6, there is another embodiment of the layout diagram of FIG. 4B. The widths of photoresist mask portions 600, 602, 604, and 606 have been increased relative to FIG. 4B. Thus, load transistor edges 409 and 410 are coincident with the edges of the photoresist portion 600. The photoresist mask portions 600, 6002, 604, and 606 may even be enlarged further such that they overlap the load transistor gate regions. This embodiment completely blocks an N-type pocket implant from the bitline terminal side of a load transistor at edges 409 and 410 while permitting the implant at the opposite edges. However, due to the absence of any clearance between the resist edge and the gate edge, if this photoresist mask is used for the lightly doped source and drain extension implants, the lightly doped extension implants will also be blocked. As a result, this embodiment requires that the pocket implant be performed with the photoresist mask of FIG. 6, and the light doped source and drain extension implants be performed with another photoresist mask wherein portions 600, 602, 604, and 606 are either narrow as in FIG. 4B or not present at all. This embodiment may be advantageously used in a fabrication process where a threshold voltage adjust photoresist mask that is not common to the light doped source and drain implant is available. This, the asymmetrical N-type pocket implant may be performed using the threshold voltage adjust mask and without an extra photoresist mask step.

Figure 7:
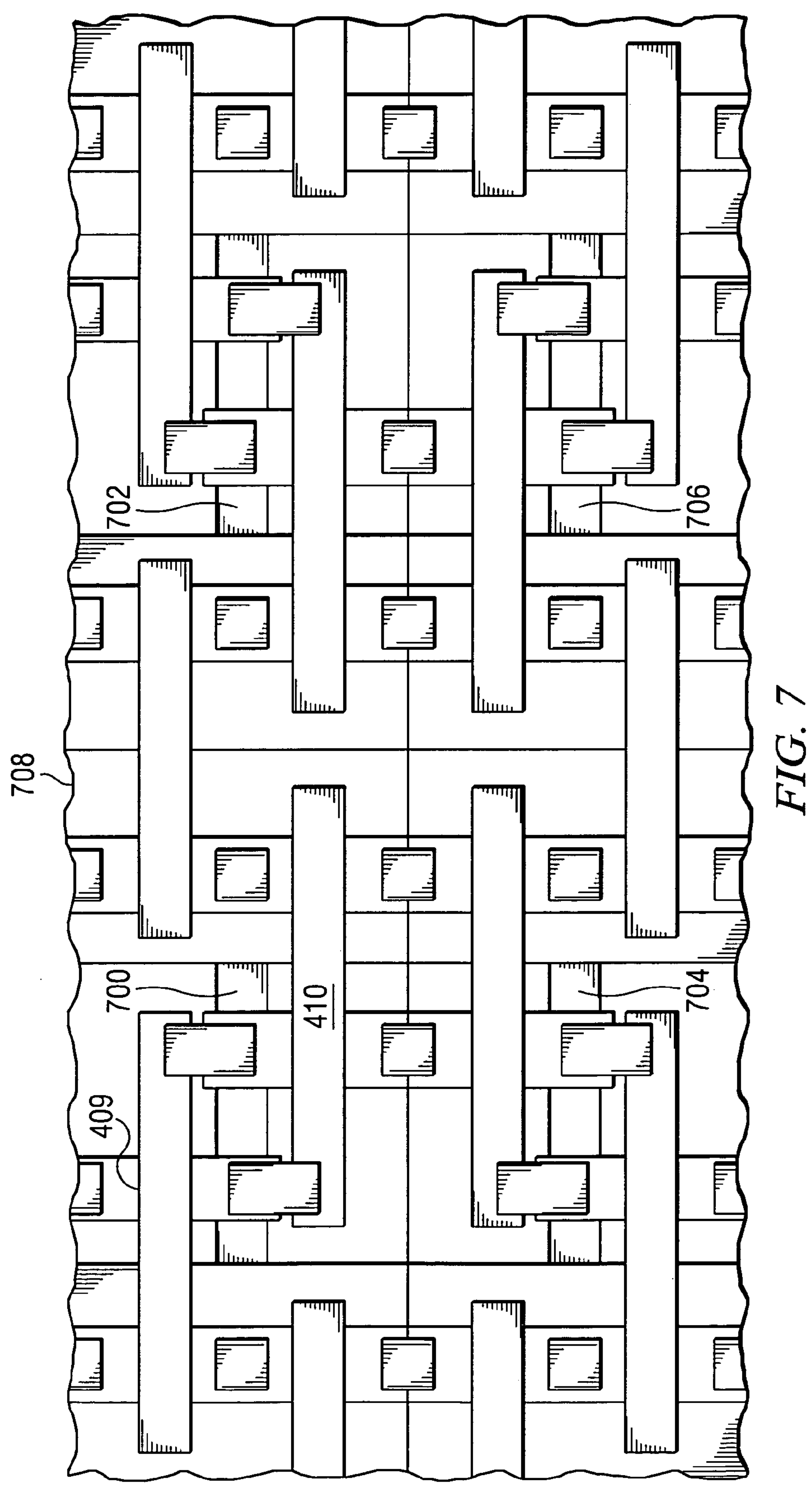
FIG. 7 is yet another embodiment of the layout diagram of FIG. 4B.

FIG. 7 is yet another embodiment of the layout diagram of FIG. 4B. The widths of photoresist mask portions 700, 702, 704, and 706 have been decreased relative to FIG. 4B. This decrease in photoresist mask width provides greater space between the load transistor edges 409 and 410 and the photoresist mask region 700. This embodiment advantageously produces a larger clearance for the lightly doped source and drain extension implants to enter the substrate adjacent both sides of the access transistor gate. The narrow photoresist mask regions are limited by manufacturing capability. However, relatively narrower photoresist mask regions such as region 700 are possible when connected to wider photoresist mask regions such as region 708. Thus, the asymmetrical N-type pocket implant and the lightly doped source and drain implants may be performed without an extra photoresist mask step according to the present embodiment.

Figure 8A:
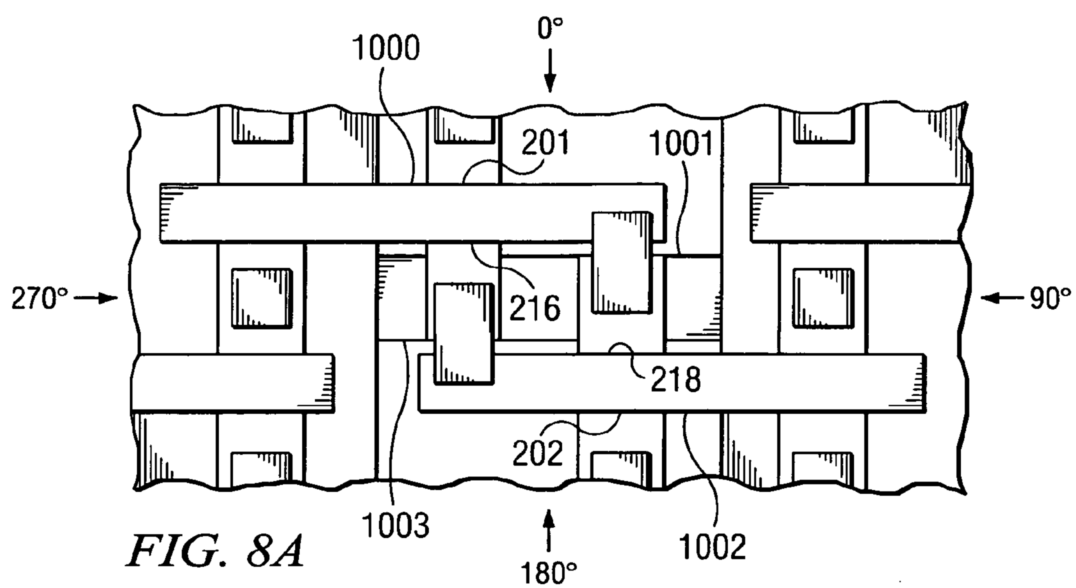
FIG. 8A is a layout diagram of a memory cell as in FIG. 2 in horizontal orientation showing the effect of implant azimuth angles on P-channel load transistors.

Turning now to FIG. 8A, there is a layout diagram of a memory cell as in FIG. 2 in horizontal orientation showing the effect of implant azimuth angles on P-channel load transistors 1000 and 1002. P-channel load transistor 1000 is adjacent photoresist mask edge 1001. P-channel load transistor 1002 is adjacent photoresist mask edge 1003. In one embodiment of the present invention, pocket implants are applied at four azimuth angles of 0°, 90°,180°, and 270°. In this embodiment 90° and 270° azimuth pocket implants will enter the substrate on both sides of the load transistors 1000 and 1002, and will therefore not create any asymmetry. The 0° and 180° azimuths create the asymmetry as follows. The 0° implant enters the storage-node side 201 of the load transistor 1000 and is blocked from the drain side 218 of the load transistor 1002. Likewise, the 180° implant enters the source side 202 of the pass transistor 1002 and is blocked from the drain side 216 of the load transistor 1000. Thus, both P-channel load transistors 1000 and 1002 advantageously receive asymmetrical N-type pocket implants.

Figure 8B:
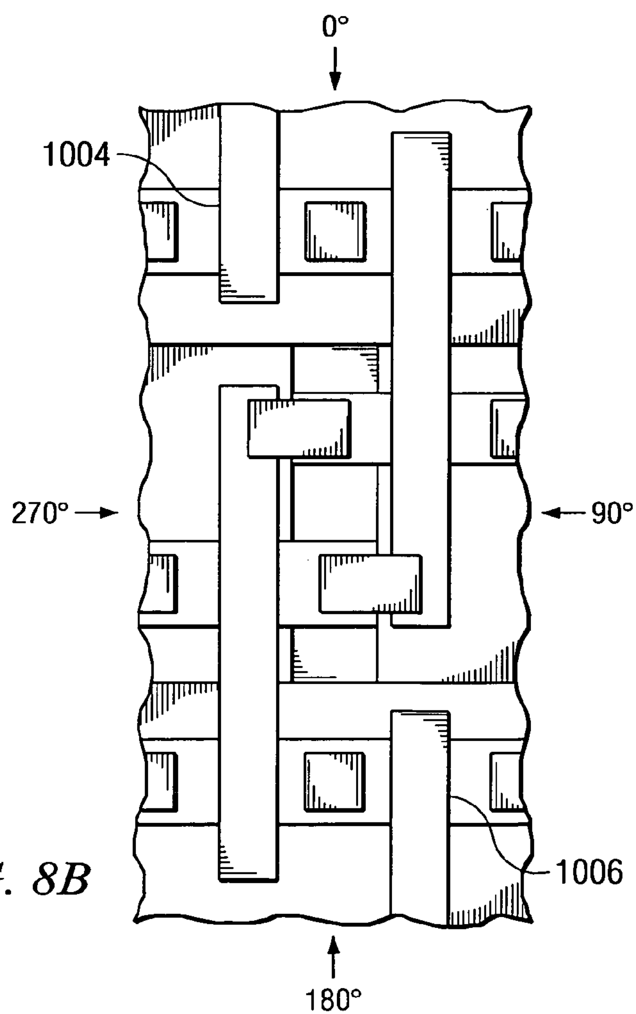
FIG. 8B is a layout diagram of a memory cell as in FIG. 2 in vertical orientation showing the effect of implant azimuth angles on P-channel load transistors.

This four-azimuth embodiment also creates asymmetrical pass transistors for memory cells placed in the orientation shown in FIG. 8B, where the 0° and 180° azimuth implants enter both sides of the load transistors and the 90° and 270° azimuth implants generate the asymmetry. In this embodiment, the lightly doped source and drain extension implants are applied either at zero tilt or at a small tilt angle preferably smaller than 7°, thus entering the substrate on all sides of the load transistors. Alternatively, they can be implanted using a separate photoresist mask as described before. If none of these alternatives is adopted, some asymmetry in lightly doped source and drain extensions will also occur, which may be acceptable in certain conditions.

In another embodiment of the present invention, pocket implants are applied at only two azimuth angles. Referring to FIG. 8A, pocket implants are applied only at the 0° and 180° azimuths. The advantage of this embodiment is that greater asymmetry is achieved since the pocket implants at 90° and 270°, which would enter the substrate on both sides of the load transistors, are no longer present. If the SRAM cells follow the orientation of FIG. 8B, however, pocket implants must be applied at the 90° and 270° azimuths. As a result, a possible disadvantage of this embodiment is that all SRAM cells must be placed in the same orientation on the chip; however, the cell orientation may be restricted for other reasons, in which case this additional reason for restriction of the orientation would not be a disadvantage. In this embodiment, lightly doped source and drain extension implants are applied either at zero tilt, or at a small tilt angle preferably smaller than 7°, or applied at any tilt angle at the 90° and 270° azimuths, thus entering the substrate on all sides of the pass transistors. Alternatively, they can be implanted using a separate photoresist mask as described before.

Figure 9A:
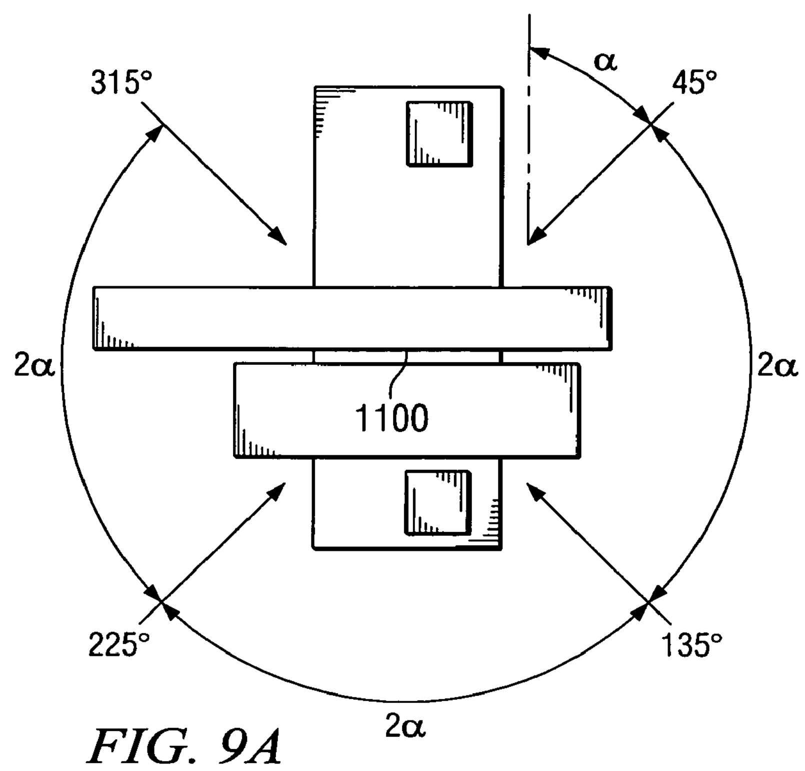
FIG. 9A is a layout diagram of a transistor in horizontal orientation showing the effect of implant azimuth angles rotated by 45 degrees with respect to FIG. 10A.
Figure 9B:
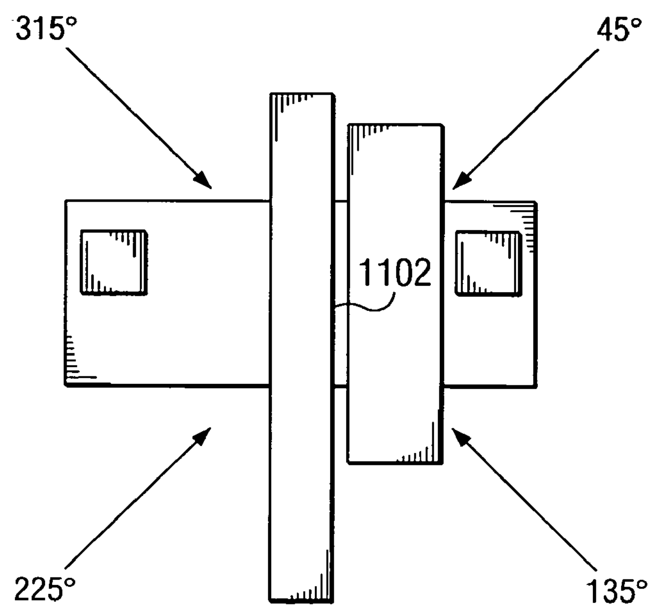
FIG. 9B is a layout diagram of a transistor in vertical orientation showing the effect of implant azimuth angles rotated by 45 degrees with respect to FIG. 10A.

In another embodiment of the present invention, the pocket implants are applied at four azimuths of 45°, 135°, 225°, and 315°. Referring now to FIG. 9A, there is a layout diagram of transistor 1100 in horizontal orientation showing the effect of implant azimuth angles rotated by 45 degrees with respect to FIG. 8A. For this cell orientation, the gate of transistor 1100 blocks the N-type pocket implant between the gate and photoresist mask 1101 for 45° and 315° azimuth angles. Likewise, the photoresist mask edge 1101 blocks the N-type pocket implant between the gate and photoresist mask 1101 for 135° and 225° azimuth angles. The N-type pocket implant, however, is applied to the opposite side of transistor 1100 by 45° and 315° azimuth angles. FIG. 9B is a layout diagram of transistor 1102 in vertical orientation showing the effect of implant azimuth angles rotated by 45 degrees with respect to FIG. 8A. For the vertical cell orientation, the gate of transistor 1102 blocks the N-type pocket implant between the gate and photoresist mask 1103 for 225° and 315° azimuth angles. Likewise, the photoresist mask edge 1103 blocks the N-type pocket implant between the gate and photoresist mask 1103 for 45° and 135° azimuth angles. The N-type pocket implant, however, is applied to the opposite side of transistor 1103 by 225° and 315° azimuth angles. Thus, a rotation of azimuth implant angles by 45° degrees with respect to FIG. 8A advantageously eliminates cell orientation dependence. In this embodiment, the lightly doped source and drain extension implants are applied either at zero tilt or at a small tilt angle preferably smaller than 7°, thus entering the substrate on all sides of the pass transistors. If they are tilted, they can be implanted at any set of azimuth angles, including 0, 90,180, and 270, or 45, 135, 225, and 215. Alternatively, they can be implanted using a separate photoresist mask as described before. If none of these alternatives is adopted, some asymmetry in lightly doped source and drain extensions may occur in this case, which may be acceptable in certain conditions.

Figure 10A:
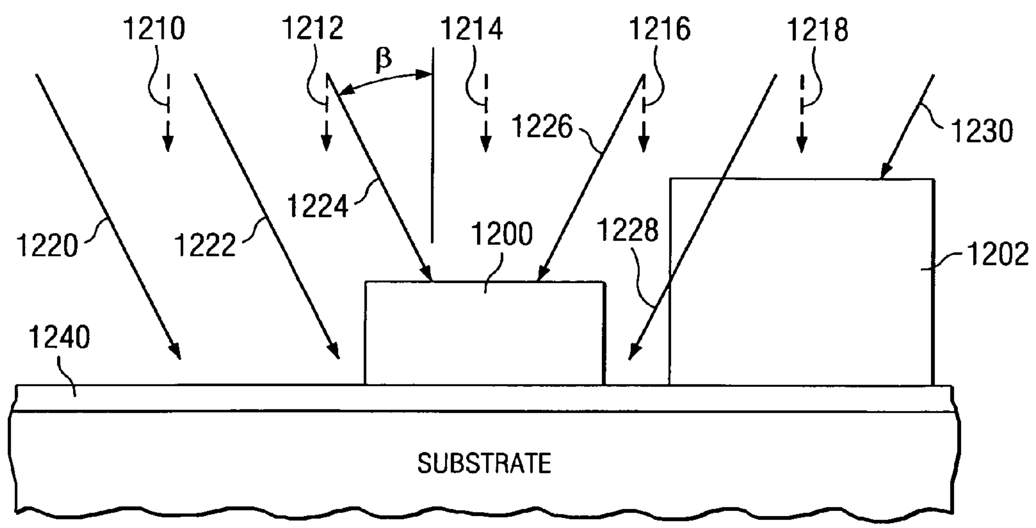
FIG. 10A is an exemplary cross section diagram showing the effect of implant tilt angle for an edge of a single transistor.

Referring to FIG. 10A, there is an exemplary cross section diagram showing the effect of implant tilt angle for an edge of a single transistor. The transistor includes gate region 1200 formed over gate dielectric 1240. A photoresist mask 1202 is closely spaced from the gate region 1200 to block an N-type pocket implant in the area there between. An LDD implant, indicated by dashed arrows 1210-1218, is applied with vertical or 0° tilt angle. Alternatively, the LDD implant may be applied at a substantially vertical tilt angle of preferably less than 7° with the same result. In this manner, the LDD implant is applied equally to both source and drain edges of the transistor, as long as there is enough clearance between the gate and the photoresist to allow the LDD implant to enter the substrate. An N-type pocket implant, indicated by solid arrows 1220-1230, is applied with tilt angle of plus or minus $\beta$ with respect to vertical as shown. In this manner, the N-type pocket implant 1220-1224 is applied to the left side of the transistor but blocked from the right side by transistor gate 1200. The N-type pocket implant 1226-1230 is blocked from the right side of the transistor by photoresist mask 1202.

Figure 10B:
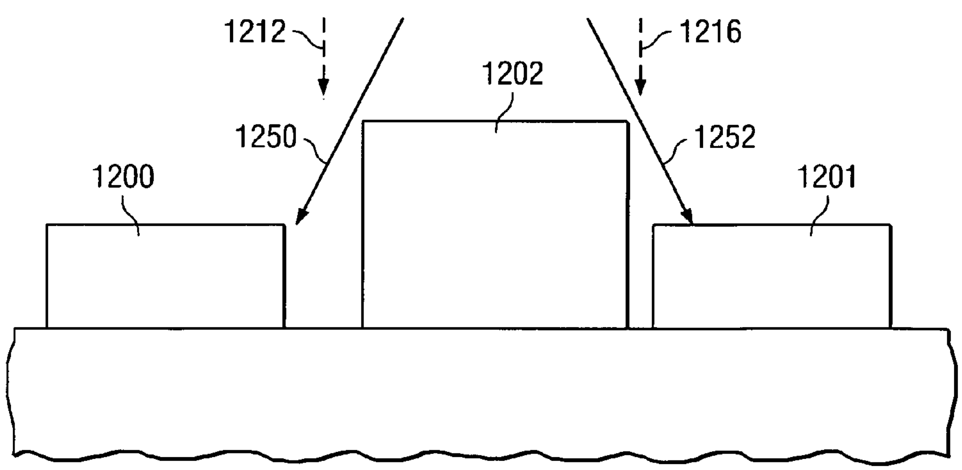
FIG. 10B is an exemplary cross section diagram showing the effect of implant tilt angle for edges of adjacent transistors.

Referring to FIG. 10B, there is an exemplary cross section diagram showing the effect of implant tilt angle for edges of adjacent transistors. The adjacent transistors include gate regions 1200 and 1201 each formed over the substrate. A photoresist mask 1202 is spaced between the two gates. The photoresist is shown with some misalignment toward the gate 1201. Because of this misalignment, relatively less photoresist exists to block the N-type pocket implant 1250 compared to the implant 1252. For a given opening 1262 between the two gates, a given photoresist CD 1261, a given misalignment or overlay error, and a given pocket implant tilt angle, there is a minimum photoresist height that must exist to ensure successful blocking of both pocket implants 1250 and 1252. In those embodiments of the present invention in which the LDD implants are not applied with the photoresist mask described in FIG. 4A, 4B, 6, or 7, successful application of the LDD implants not a consideration in designing the photoresist mask.

Figure 11:
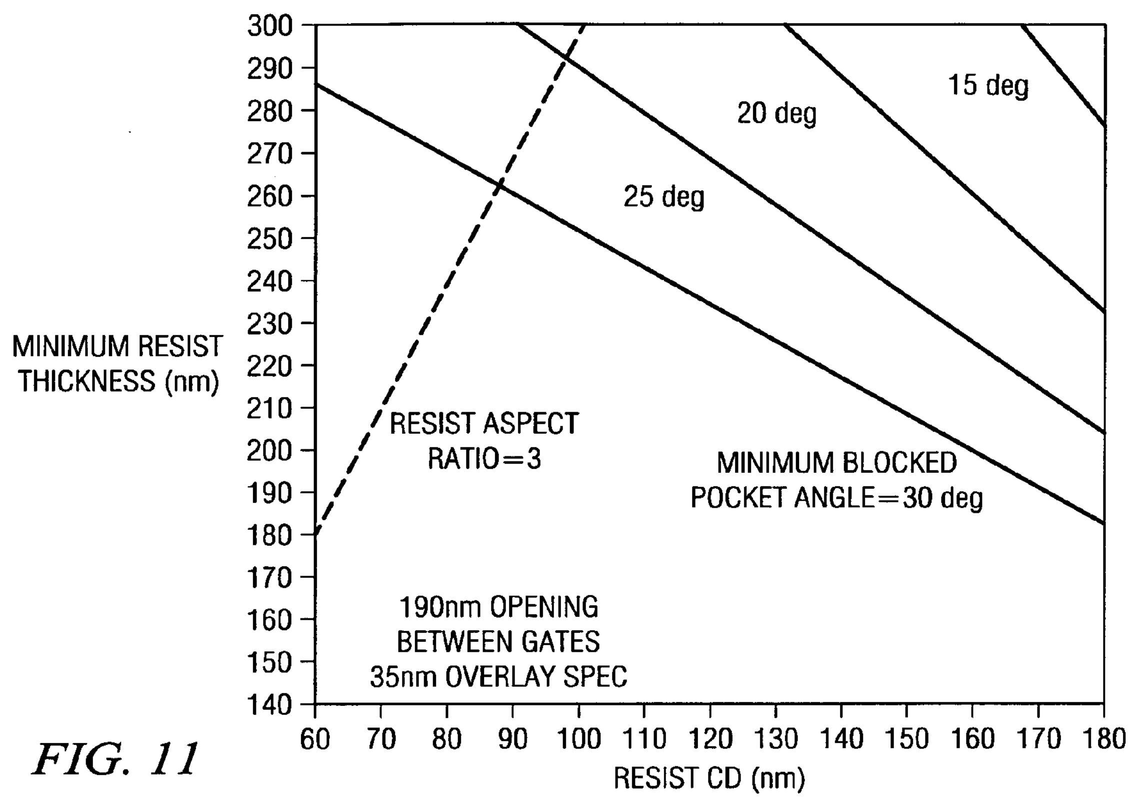
FIG. 11 is a graph showing minimum tilt implant angle required to block a pocket implant as a function photoresist thickness and space from a gate edge with 25 nm misalignment.
Figure 12:
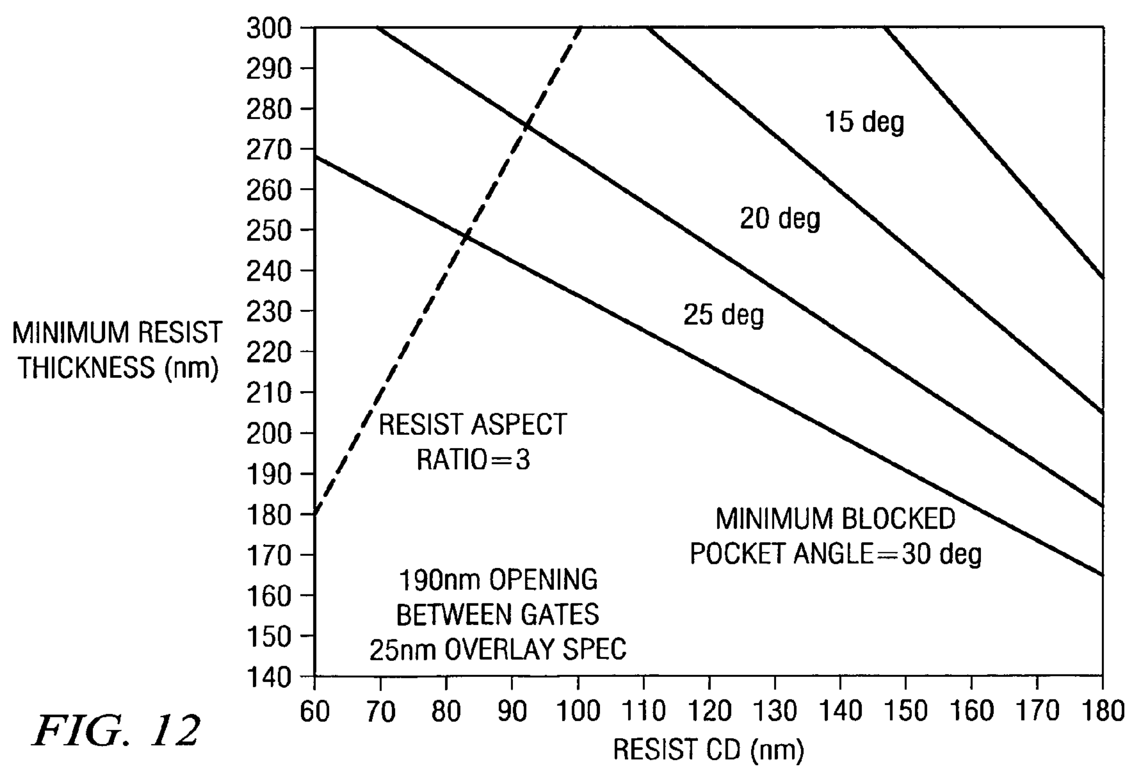
FIG. 12 is a graph showing minimum tilt implant angle required to block a pocket implant as a function photoresist thickness and space from a gate edge with 30 nm misalignment.
Figure 13:
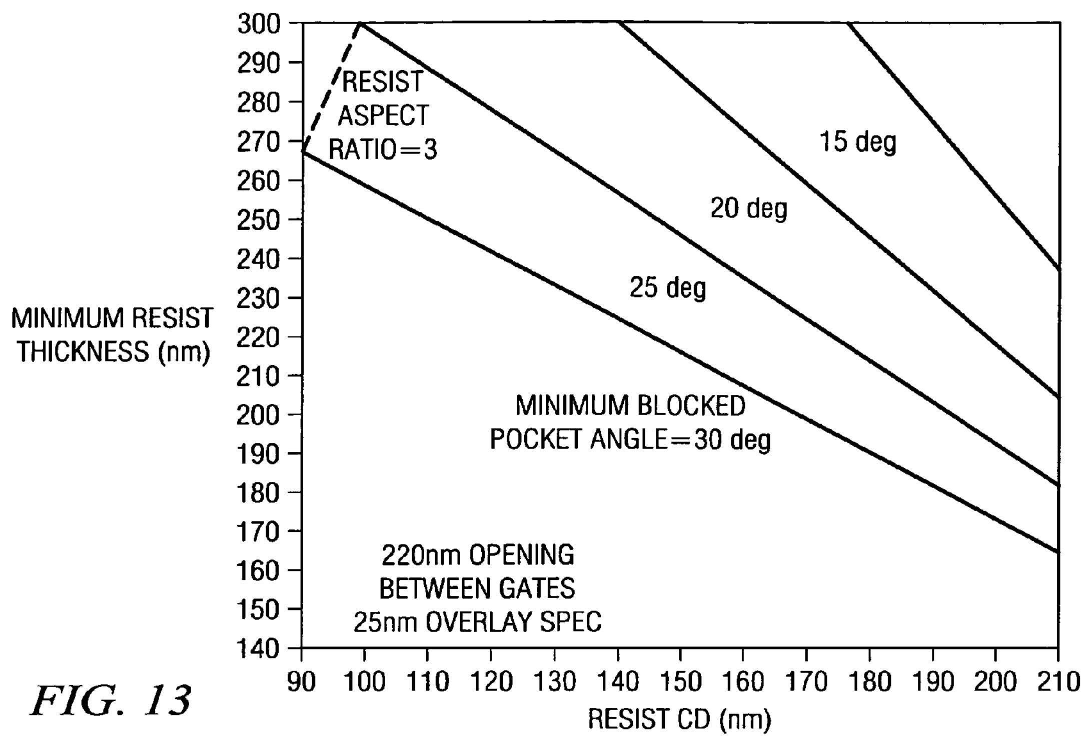
FIG. 13 is a graph showing minimum tilt implant angle required to block a pocket implant as a function photoresist thickness and space from a gate edge with 35 nm misalignment.

FIGS. 11-13 show graphs of the minimum photoresist height required to block the pocket implant for various misalignment conditions. FIG. 11 is a graph showing minimum photoresist height required to block pocket implants for a 190 nm opening between the gates and with 35 nm misalignment. FIG. 12 is a graph showing minimum photoresist height required to block pocket implants for a 190 nm opening between the gates and with 25 nm misalignment. FIG. 13 is a graph showing minimum photoresist height required to block the pocket implants for a 220 nm opening between the gates and with 25 nm misalignment.

Figure 14:
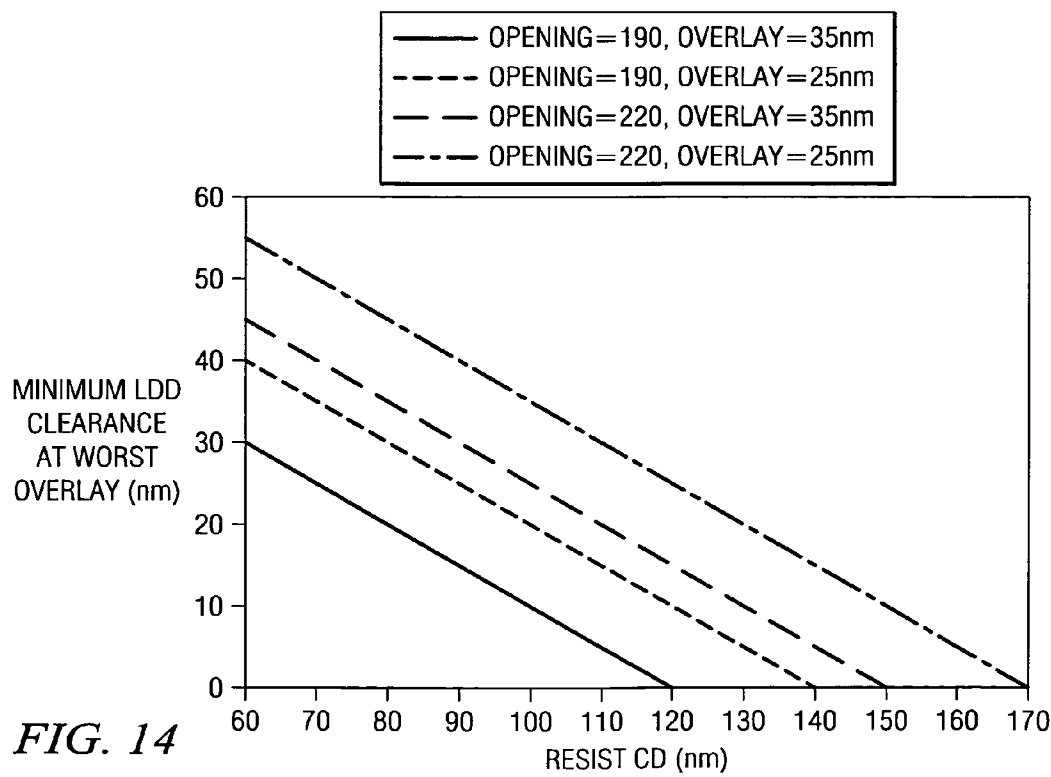
FIG. 14 is a graph showing the minimum LDD clearance for various resist CD's, gate-to-gate opening spaces, and overlay specifications.

In those embodiments of the present invention where LDD implants are applied using the same photoresist mask as the pocket implants, the photoresist mask must not only block the pocket implants but also permit the LDD implants to reach the substrate on both source and drain sides of the gates. Returning to FIG. 10B, because of the misalignment, the clearance for the LDD implant is smaller near the gate 1201 compared to near the gate 1200. For a given opening between the gates, the photoresist CD and the misalignment specification must be set such that the necessary clearance will depend on process details such as the LDD implant dose, the amount of diffusion occurring in subsequent thermal steps, and the design of the heavily doped source and drain regions in any specific manufacturing process. FIG. 14 shows a graph of the LDD implant clearance as a function of the photoresist CD, the opening between the gates, and the overlay specification. For example, with a resist CD of 110 nm, an overlay specification of 25 nm, and a gate to gate opening of 220 nm, a satisfactory minimum clearance of 30 nm is obtained.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. In view of the foregoing discussion, it is intended that the appended claims encompass any such modifications or embodiments.

What is claimed is:

1. A method of fabricating an integrated circuit having an SRAM memory cell, comprising the steps of:

forming a gate structure for a load transistor of said SRAM memory cell over a semiconductor body;

forming a first source/drain region on a storage node side of said gate structure and a second source/drain region on a supply side of the gate structure;

implanting a dopant into a pocket region on the supply side of the load transistor while at least partially blocking the dopant from the storage node side of the load transistor;

connecting said first source/drain region to a storage node; and connecting the second source/drain region to a supply voltage.

2. The method of claim 1, wherein said first and second source/drain regions are a first conductivity type and said pocket region is a second conductivity type.

3. The method of claim 1, wherein said step of implanting a dopant into the pocket region comprises implanting at a tilt angle and first and second azimuth angles, wherein the tilt angle is greater than 10 degrees with respect to a line perpendicular to the surface, and wherein the first azimuth angle is between 0 degrees and 90 degrees with respect to one of a width and a length direction of said gate structure and the second azimuth angle is offset from the first azimuth angle by an integral multiple of 90 degrees.

4. The method of claim 1, further comprising the steps of:

forming a first implant mask over the semiconductor body;

using said first implant mask, forming lightly doped source/drain regions on the supply side and on the storage side; and removing said first implant mask;

forming a second implant mask prior to said step of implanting a dopant into the pocket region;

using said second implant mask, forming threshold voltage adjust implants; and removing said second implant mask after said step of implanting a dopant into the pocket region.

5. The method of claim 1, further comprising the steps of:

forming an implant mask over the semiconductor body prior to said step of implanting a dopant;

using said implant mask, forming a first lightly doped source/drain region on the storage node side and a second lightly doped source/drain region on the supply side; and removing said implant mask after said step of implanting a dopant.

6. The method of claim 5, wherein said step of implanting a dopant comprises performing an angled implant using said implant mask such that said dopant is blocked from said storage node side.

7. The method of claim 5, wherein said step of implanting a dopant comprising implanting at azimuth angles of 45°, 135°, 225°, and 315° with respect to one of a width and a length direction of said gate structure.

8. A method of fabricating an asymmetrical load transistor for a memory cell on a substrate having a first conductivity type, comprising the steps of:

forming a dielectric region on a surface of the substrate;

forming a gate region having a length and a width on the dielectric region;

forming a mask region parallel to the gate region and adjacent one side of the gate region, the mask region extending in the width direction; and implanting a first impurity to form a pocket region, the first impurity having the first conductivity type and being implanted at a tilt angle and first and second azimuth angles, wherein the tilt angle is greater than 10 degrees with respect to a line perpendicular to the surface, and wherein the first azimuth angle is substantially between 0 degrees and 90 degrees with respect to one of the width and length direction and the second azimuth angle is offset from the first azimuth angle by substantially an integral multiple of 90 degrees.

9. The method of claim 8, further comprising the step of implanting a second impurity having a second conductivity type to form a source region and a drain region, wherein said pocket region is located adjacent said source region.

10. The method of claim 8, wherein said drain region is connected to a storage node and said source region is connected to a supply voltage.

* * * * *